: US 8,035,095 B2
(45) Date of Patent: Oct. 11, 2011

(12) United States Patent
Lee et al.

(54) RESISTIVE RANDOM ACCESS MEMORY DEVICE

(75) Inventors: Jung-hyun Lee, Yongin-si (KR); Myoung-jae Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 81 days.

(21) Appl. No.: 12/007,013

(22) Filed: Jan. 4, 2008

(65) Prior Publication Data

US 2009/0052226 A1 Feb. 26, 2009

(30) Foreign Application Priority Data

Aug. 24, 2007 (KR) .................. 10-2007-0085558

(51) Int. Cl.
*H01L 45/00* (2006.01)
(52) U.S. Cl. .............. 257/4; 257/E45.003; 365/148
(58) Field of Classification Search .............. 257/2, 288, 257/E47.001, 3, 4, 295, 309, E29.17, E45.003, 257/E31.029, E31.03, E27.004, E45.002, E21.158; 365/148, 100, 158, 200
See application file for complete search history.

(56) References Cited

U.S. PATENT DOCUMENTS

| | | | |
|---|---|---|---|
| 2005/0156256 A1* | 7/2005 | Kim et al. ............. | 257/410 |
| 2005/0194622 A1* | 9/2005 | Lee et al. ............. | 257/288 |
| 2006/0054950 A1* | 3/2006 | Baek et al. ............ | 257/295 |
| 2007/0108431 A1* | 5/2007 | Chen et al. ........... | 257/4 |
| 2007/0274121 A1* | 11/2007 | Lung et al. ........... | 365/148 |
| 2009/0102598 A1* | 4/2009 | Yamazaki et al. ..... | 338/20 |

* cited by examiner

*Primary Examiner* — Thomas L Dickey
*Assistant Examiner* — Fazli Erdem
(74) *Attorney, Agent, or Firm* — Harness, Dickey & Pierce, P.L.C.

(57) ABSTRACT

Provided is a resistive random access memory device that includes a storage node connected to a switching device. The resistive random access memory device includes a first electrode, a resistance variable layer, and a second electrode which are sequentially stacked, wherein a diffusion blocking layer is formed between the first electrode and the resistance variable layer or between the resistance variable layer or/and the second electrode.

8 Claims, 3 Drawing Sheets

RESISTIVE RANDOM ACCESS MEMORY DEVICE

CROSS-REFERENCE TO RELATED PATENT APPLICATION

This application claims the benefit of Korean Patent Application No. 10-2007-0085558, filed on Aug. 24, 2007, in the Korean Intellectual Property Office, the disclosure of which is incorporated herein in its entirety by reference.

BACKGROUND OF THE INVENTION

1. Field of the Invention

The present invention relates to a semiconductor device, and more particularly, to a resistive random access memory device.

2. Description of the Related Art

Dynamic random access memories (DRAMs) have the advantages of having high integration density and high response speed; however, have disadvantages in terms of losing stored data when power is turned off. Nonvolatile memory devices are memory devices in which the drawbacks of DRAMs do not apply, and thus, recently various nonvolatile memory devices have been proposed. Among such nonvolatile memory devices, resistive random access memories (RRAMs) have drawn attention as nonvolatile memory devices having high integration density and high response speed like DRAMs.

A conventional storage node of a RRAM has a structure in which a lower electrode, a resistance variable layer, and an upper electrode are sequentially stacked.

FIG. 1 is a cross-sectional view of a conventional storage node S1 of a conventional RRAM.

Referring to FIG. 1, the conventional storage node S1 has a structure in which a lower electrode 10, a resistance variable layer 20, and an upper electrode 30 are sequentially stacked. The lower electrode 10 and the upper electrode 30 are formed of Pt, and the resistance variable layer 20 is formed of nickel oxide ($NiO_x$). According to a voltage that is applied between the lower electrode 10 and the upper electrode 30, a current path 1 is formed in the resistance variable layer 20 or the current path 1 is not formed in the resistance variable layer 20. When the current path 1 is formed in the resistance variable layer 20, electrical resistance in the resistance variable layer 20 is low, and this is referred to as an ON state. If the current path 1 is not formed in the resistance variable layer 20, electrical resistance in the resistance variable layer 20 is high, and this is referred to an OFF state.

The principle of generating the current path 1 in the resistance variable layer 20 will now be described in detail. When a negative voltage is applied to the resistance variable layer 20 and a positive voltage is applied to the upper electrode 30, electrons migrate into the resistance variable layer 20 from the upper electrode 30 to the lower electrode 10. These electrons have high energy, and thus, break the bonding between oxygen and nickel in the resistance variable layer 20. Thus, oxygen atoms diffuse to the lower electrode 10 resulting in the generation of oxygen vacancies in the resistance variable layer 20, and thus, the current path 1 is formed in the resistance variable layer 20 in this manner. Such diffusion of oxygen atoms is called percolation diffusion.

However, the oxygen atoms not only diffuse in the resistance variable layer 20 but also out diffuse towards at least one of the lower electrode 10 and the upper electrode 30. Therefore, an endurance of the resistance variable layer 20 and the conventional RRAM is reduced. That is, because of the out diffusion, the characteristics of the resistance variable layer 20 are easily degraded as the switching frequency increases, and in a severe case, the characteristics of the resistance variable layer 20 can be completely lost.

SUMMARY OF THE INVENTION

To address the above and/or other problems, the present invention provides a resistive random access memory device having high endurance.

According to an aspect of the present invention, there is provided a resistive random access memory device including a switching device and a storage node connected to the switching device, the storage node comprises a first electrode, a resistance variable layer, and a second electrode which are sequentially stacked, wherein a diffusion blocking layer is formed either between the first electrode and the resistance variable layer or between the resistance variable layer and the second electrode.

The diffusion blocking layer may have a bonding energy greater than that of the resistance variable layer.

The resistance variable layer may be a transition metal oxide layer, and the diffusion blocking layer is a nitride layer.

The transition metal oxide layer may be formed of one selected from the group consisting of a nickel oxide layer, a titanium oxide layer, a zirconium oxide layer, a zinc oxide layer, and a copper oxide layer.

The nitride layer may be a silicon nitride layer or a boron nitride layer.

The first electrode and the second electrode may be Pt layers.

The diffusion blocking layer may have a thickness T of $0 < T \leq 50$ Å.

The resistive random access memory device may further comprise the diffusion blocking layer either between the first electrode and the resistance variable layer or between the resistance variable layer and the second electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
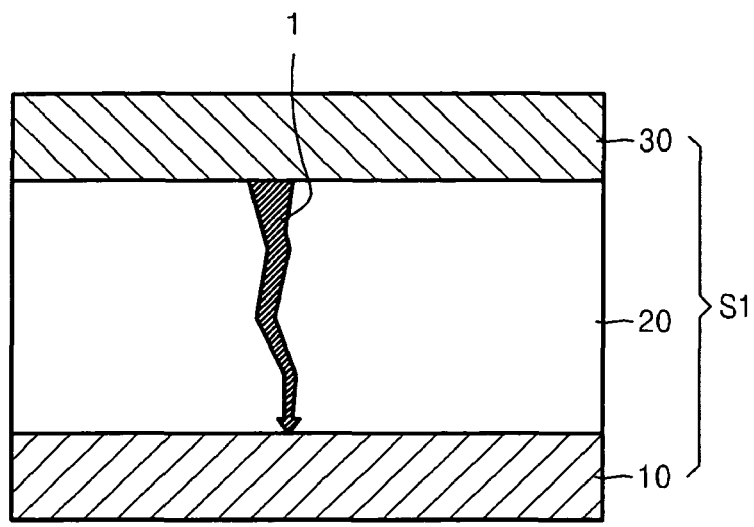
FIG. 1 is a cross-sectional view of a conventional storage node of a conventional resistive random access memory (RRAM) device.

The present invention will now be described more fully with reference to the accompanying drawings in which exemplary embodiments of the invention are shown. In the drawings, the thicknesses of layers and regions are exaggerated for clarity, and like reference numerals refer to the like elements.

Figure 2:
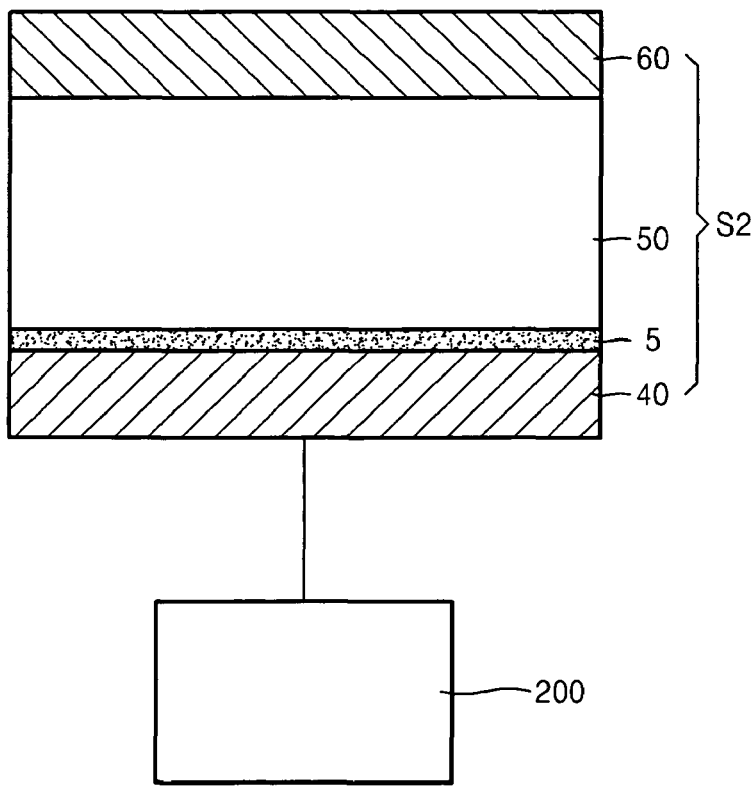
FIG. 2 is a cross-sectional view of a RRAM device according to an embodiment of the present invention.

FIG. 2 is a cross-sectional view of a RRAM device according to an embodiment of the present invention.

Referring to FIG. 2, a switching device 200 is connected to a storage node S2. The switching device 200 can be a transistor or a diode. The storage node S2 includes a lower electrode 40, a resistance variable layer 50, and an upper electrode 60 that are sequentially formed. A diffusion blocking layer 5 is formed between the lower electrode 40 and the resistance variable layer 50 or between the resistance variable layer 50 and the upper electrode 60, for example, in the present embodiment, the diffusion blocking layer 5 is formed between the lower electrode 40 and the resistance variable layer 50. The diffusion blocking layer 5 blocks the diffusion of chemical species from the resistance variable layer 50 into the lower electrode 40. The diffusion blocking layer 5 may have a bonding energy greater than that of the resistance variable layer 50 because it is desirable that the chemical species that diffuse from the resistance variable layer 50 do not bond with chemical species of the diffusion blocking layer 5. The resistance variable layer 50 can be a transition metal oxide layer having a non-stoichiometric composition, for example, a nickel oxide layer (a $NiO_x$ layer), a titanium oxide layer ($TiO_x$ layer), a zirconium oxide layer ($ZrO_x$ layer), a zinc oxide layer ($ZnO_x$ layer), or a copper oxide layer ($CuO_x$ layer). The diffusion blocking layer 5 can be a nitride layer such as a silicon nitride layer ($Si_xN_y$ layer) or a boron nitride layer ($B_xN_y$ layer). For example, if the resistance variable layer 50 is a nickel oxide layer ($NiO_x$ layer), the diffusion blocking layer 5 is a silicon nitride layer ($Si_xN_y$ layer). Si has an oxidation force lower than that of Ni, and is bonded with N in the silicon nitride layer. Thus, oxygen atoms that diffuse into the diffusion blocking layer 5 from the resistance variable layer 50 do not easily bond with the diffusion blocking layer 5. Therefore, it is difficult for oxygen atoms to move into the lower electrode 40, and the oxygen atoms can stay on an upper surface of the diffusion blocking layer 5 with a weak bonding force with the diffusion blocking layer 5. The oxygen atoms present on the upper surface of the diffusion blocking layer 5 can be re-diffused into the resistance variable layer 50. That is, the moving (diffusion) range of the oxygen atoms can be limited to the resistance variable layer 50. In this manner, the diffusion of the oxygen atoms can be limited to not occur into the lower electrode 40 due to the diffusion blocking layer 5, and thus, the resistance variable layer 50 and the RRAM that includes the resistance variable layer 50 can have high endurance.

The diffusion blocking layer 5 can be formed to a thickness of 50 Å or less, preferably, 5 to 15 Å using a predetermined deposition method, for example, an atomic layer deposition (ALD) method. The tunneling of electrons through the diffusion blocking layer 5 having above such thickness is easy, and thus, a current path that connects the lower electrode 40 to the upper electrode 60 can be readily formed.

Figure 3:
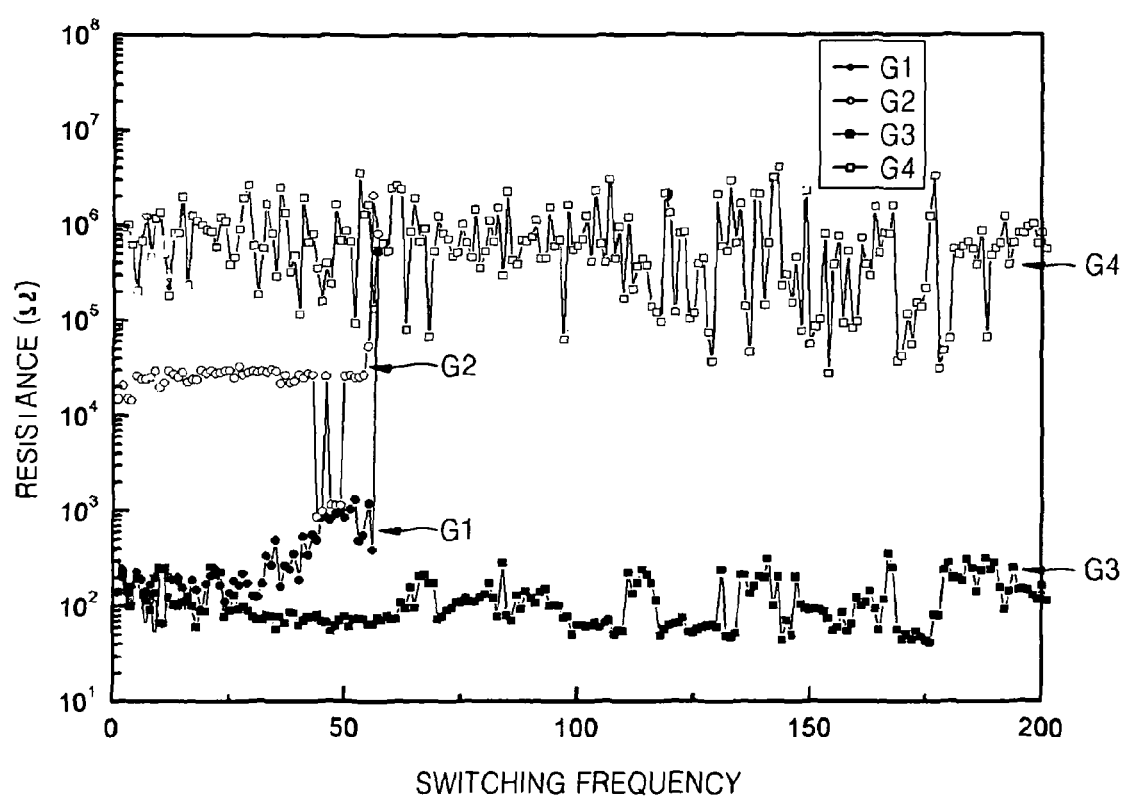
FIG. 3 is a graph showing resistance variations according to a switching of a conventional RRAM and a RRAM according to an embodiment of the present invention.

FIG. 3 is a graph showing resistance variations according to the switching of a conventional RRAM and a RRAM, according to an embodiment of the present invention. In FIG. 3, first and second plots G1 and G2 are the resistance variations of the conventional RRAM that includes the conventional storage node S1 of FIG. 1, and third and fourth plots G3 and G4 are the resistance variations of the RRAM having the storage node S2 of FIG. 2, according to the present embodiment. The first and third plots G1 and G3 are the results of resistance states when a current path is formed in the resistance variable layers 20 and 50, that is, the results corresponding to a low resistance state, and the second and fourth plots G2 and G4 are the resistance states when a current path is not formed in the resistance variable layers 20 and 50, that is, the results corresponding to a high resistance state.

Referring to FIG. 3, the first and second plots G1 and G2 have lengths in a horizontal axis direction shorter than those of the third and fourth plots G3 and G4 in a horizontal axis direction. The first and second plots G1 and G2 are seen until the switching is approximately 60 times. However, the third and fourth plots G3 and G4 are continuously seen within the measuring range. This result denotes that the switching a characteristic of the RRAM according to the present embodiment maintains longer than that of the conventional RRAM. Thus, confirming that the endurance of the RRAM according to the present embodiment of the present invention is increased due to the diffusion blocking layer 5.

The configuration of the storage node S2 of FIG. 2 can be modified in various ways, and thus, the present invention is not limited to the one shown. For example, the switching device 200 can be connected to the upper electrode 60 instead of to the lower electrode 40, and the diffusion blocking layer 5 can be formed between the resistance variable layer 50 and the upper electrode 60 instead of being formed between the lower electrode 40 and the resistance variable layer 50. Also, as depicted in FIG. 4, diffusion blocking layers 5 and 5' can be formed between the lower electrode 40 and the resistance variable layer 50 and between the resistance variable layer 50 and the upper electrode 60.

Figure 5:
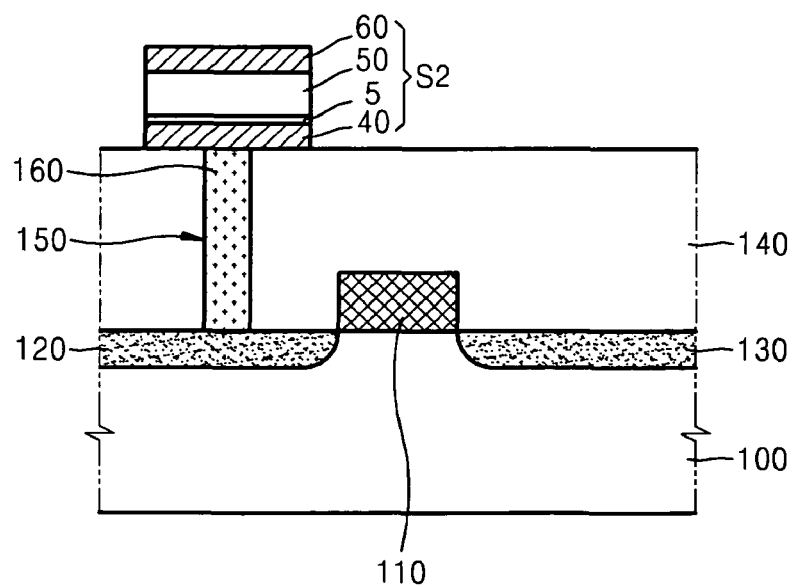
FIG. 5 is a cross-sectional view of a RRAM according to another embodiment of the present invention.

FIG. 5 is a cross-sectional view showing an example of the embodied structure of the switching device 200 and the connection between the switching device 200 and the storage node S2 of FIG. 2.

Referring to FIG. 5, a gate 110 is formed on a substrate 100, and first and second dopant regions 120 and 130 are formed in the substrate 100 on both sides of the gate 110. One of the first and second dopant regions 120 and 130 is a source and the other is a drain. The gate 110 and the first and second dopant regions 120 and 130 constitute a transistor, that is, a switching device. An interlayer insulating layer 140 that covers the transistor is formed on the substrate 100. A contact hole 150 that exposes the first dopant region 120 is formed in the interlayer insulating layer 140, and the contact hole 150 is filled with a conductive plug 160. The storage node S2, which covers an exposed portion of the conductive plug 160, is formed on the interlayer insulating layer 140. The storage node S2 of FIG. 5 can also be replaced by the storage node S2' of FIG. 4. Although not shown, a bit line that is electrically connected to the second dopant region 130 can be formed. According to a voltage that is applied to the gate 110 and the bit line, a voltage can be applied to the lower electrode 40, and according to a voltage that is applied to the lower electrode 40 and the upper electrode 60, the formation of a current path in the resistance variable layer 50 is determined.

Figure 4:
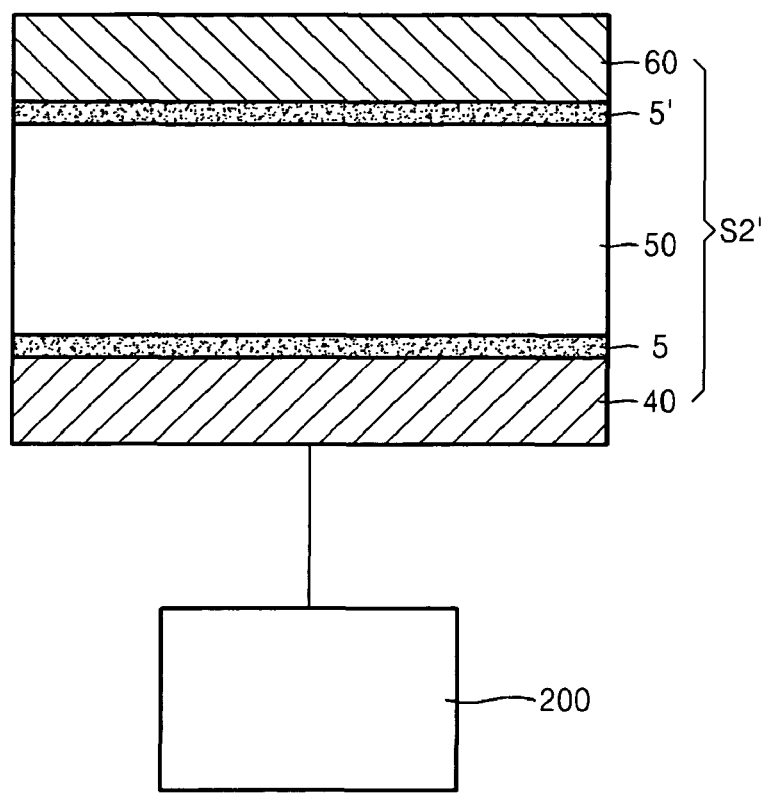
FIG. 4 is a cross-sectional view of a RRAM according to another embodiment of the present invention.

Although not shown, according to the present embodiment, the switching devices 200 of FIGS. 2 and 4 can be diodes. In this case, the RRAM according to the present invention can be a multi-layer cross point RRAM having a unit cell of 1D(diode)-1R(resistor) structure.

In RRAMs according to embodiments of the present invention, the diffusion of chemical species to the outside of a resistance variable layer is prevented or minimized using a diffusion blocking layer, and thus, the endurance of the resistance variable layer and the RRAM that includes the resistance variable layer can be increased.

While the present invention has been shown and described with reference to embodiments thereof, it should not be construed as being limited to such embodiments. One skilled in this art knows that, for example, elements that constitute the storage nodes S2 and S2' can be different and the storage nodes S2 and S2' can have different structures as to the ones shown. Different films than the ones shown above can be formed between the lower electrode 40 and the resistance variable layer 50 and between the resistance variable layer 50 and the upper electrode 60. The shapes of the lower electrode 40, the resistance variable layer 50, and the upper electrode 60 can be modified in various ways. Therefore, the scope of the invention is not defined by the detailed description of the invention however by the appended claims.

What is claimed is:

1. A resistive random access memory device, comprising:
   a switching device;
   a storage node connected to the switching device, the storage node including a first electrode, a resistance variable layer, and a second electrode which are sequentially stacked; and
   a diffusion blocking layer, including a boron nitride layer, between the first electrode and the resistance variable layer or between the resistance variable layer and the second electrode,
   wherein the resistance variable layer is a transition metal oxide layer adapted to change resistance according to a voltage applied to the resistance variable layer.

2. The resistive random access memory device of claim 1, wherein the diffusion blocking layer has a bonding energy greater than that of the resistance variable layer.

3. The resistive random access memory device of claim 1, wherein the transition metal oxide layer is formed of one selected from the group consisting of a nickel oxide layer, a titanium oxide layer, a zirconium oxide layer, a zinc oxide layer, and a copper oxide layer.

4. The resistive random access memory device of claim 1, wherein the first electrode and the second electrode are platinum (Pt) layers.

5. The resistive random access memory device of claim 1, wherein the diffusion blocking layer has a thickness T of $0 < T \leqq 50$ Å.

6. The resistive random access memory device of claim 1, wherein the diffusion blocking layer is between the first electrode and the resistance variable layer and between the resistance variable layer and the second electrode.

7. A resistive random access memory device, comprising:
   a switching device and a storage node connected to the switching device, the storage node including a first electrode, a resistance variable layer and a second electrode, sequentially stacked; and
   a diffusion blocking layer, including a boron nitride layer, between the first electrode and the resistance variable layer or between the resistance variable layer and the second electrode,
   wherein the resistance variable layer includes a transition metal oxide, and
   at least one of the first electrode and the second electrode is a platinum (Pt) layer.

8. The resistive random access memory device of claim 7, wherein the diffusion blocking layer is between the first electrode and the resistance variable layer and between the resistance variable layer and the second electrode.

* * * * *